(12) United States Patent
Xu

(10) Patent No.: US 6,958,598 B2
(45) Date of Patent: Oct. 25, 2005

(54) EFFICIENT SWITCHING ARCHITECTURE WITH REDUCED STUB LENGTHS

(75) Inventor: Fang Xu, Newton, MA (US)

(73) Assignee: Teradyne, Inc., Boston, MA (US)

( * ) Notice: Subject to any disclaimer, the term of this patent is extended or adjusted under 35 U.S.C. 154(b) by 15 days.

(21) Appl. No.: 10/675,083

(22) Filed: Sep. 30, 2003

(65) Prior Publication Data

US 2005/0068898 A1    Mar. 31, 2005

(51) Int. Cl.$^7$ .......................... H03K 17/00; H04M 3/00
(52) U.S. Cl. ................. 324/158.1; 340/2.28; 340/2.29; 379/291; 379/292
(58) Field of Search ........................... 324/158.1, 73.1; 379/27.06, 304, 319, 320, 323, 291–292, 379/268, 306, 335; 340/2.27–2.29

(56) References Cited

U.S. PATENT DOCUMENTS

| | | | |
|---|---|---|---|
| 3,435,417 A * | 3/1969 | Haselton, Jr. ............. 340/2.27 |
| 4,620,304 A | 10/1986 | Faran, Jr. ..................... 371/20 |
| 4,635,250 A * | 1/1987 | Georgiou .................... 370/380 |
| 4,798,435 A | 1/1989 | Fujiwara et al. ......... 350/96.13 |
| 4,837,855 A * | 6/1989 | Hajikano et al. ............ 398/55 |
| 5,124,636 A | 6/1992 | Pincus ....................... 324/73.1 |
| 5,124,638 A | 6/1992 | Winroth ...................... 324/158 |
| 5,237,565 A * | 8/1993 | Henrion et al. ............ 370/236 |
| 5,243,272 A | 9/1993 | Hall ........................... 324/158 |
| 5,371,786 A * | 12/1994 | Paul ........................... 379/292 |
| 6,084,873 A * | 7/2000 | Russell et al. ............. 370/352 |
| 6,236,300 B1 * | 5/2001 | Minners ..................... 337/139 |
| 6,594,261 B1 * | 7/2003 | Boura et al. ................ 370/389 |
| 2003/0043015 A1 | 3/2003 | Gershfeld .................. 340/2.28 |

FOREIGN PATENT DOCUMENTS

FR    2 538 912 A    7/1984
JP    56117495    9/1981

OTHER PUBLICATIONS

On the bisection width and expansion of butterfly networks Bornstein, C.; Litman, A.; Maggs, B.M.; Sitaraman, R.K.; Yatzkar, T.; Parallel Processing Symposium, 1998. 1998 IPPS/SPDP. Proceedings of the First Merged International . . . and Symposium on Parallel and Distributed Processing 1998, Mar. 30-Apr. 3, 1998 Page(s): 144-150.
International Search Report.
"Logically Controlled Chip Interconnection Technique" IBM Technical Disclosure Bulletin, IBM Corp. New York, US—vol. 32, no 3B, Aug. 1, 1989, pp. 294-299, XP000029849, ISSN: 0018-8689, figure 3.
Patent Abstract of Japan, JP 56 117495 A (Meisei Electric Co Ltd), Sep. 14, 1981 abstract; figures 1,3.

* cited by examiner

Primary Examiner—Paresh Patel

(57) ABSTRACT

A switching topology for communicating signals in an automatic test system includes a plurality of switching circuits each for selectively passing signals or crossing signals. Switching circuits are connected together such that each node of any switching circuit connects to no more than one node of any other switching circuit. This topology offers improved signal integrity, reduced cost, and reduced space as compared with conventional, matrix-style switching topologies.

8 Claims, 3 Drawing Sheets

THROUGH

CROSS

Symbol

EFFICIENT SWITCHING ARCHITECTURE WITH REDUCED STUB LENGTHS

CROSS-REFERENCES TO RELATED APPLICATIONS

Not Applicable.

STATEMENT REGARDING FEDERALLY SPONSORED RESEARCH OR DEVELOPMENT

Not Applicable.

Reference to Microfiche Appendix

Not Applicable

BACKGROUND OF THE INVENTION

1. Field of the Invention

This invention relates generally to automatic test equipment, and, more particularly, to switching topologies used for routing signals in automatic test systems.

2. Description of Related Art

Automatic systems for testing electronics devices and assemblies commonly use switching matrices for routing electrical signals. These systems often contain numerous tester resources that can exchange electrical signals with a unit under test, or "UUT." Tester resources come in many different forms, and may include, for example, power supplies, voltage sources, current sources, waveform generators, meters, sampling circuits, and time measurement circuits. The UUT can take different forms as well, including, for example, semiconductor wafers, packaged semiconductor chips, hybrid assemblies, unloaded circuit boards, and circuit board assemblies.

A switching matrix is commonly placed between the tester resources and the UUT to flexibly connect tester resources to I/O terminals of the UUT (e.g., leads, pins, or connector terminals). Ideally, the matrix is flexible enough to connect any of the tester resources to any of the I/O terminals of the UUT. The matrix is also ideally flexible enough to connect any tester resource to any other tester resource. This latter capability allows tester resources to calibrate and/or test one another via signal loop-back.

FIGS. 1 and 2 show a conventional switching matrix 100 for electronic test systems. The matrix 100, often called a "full-crosspoint" matrix, includes intersecting conductive paths organized in rows and columns with a switch at each intersection point. Tester resources can be connected to the matrix at nodes A–N, and I/O terminals of UUTs can be connected at nodes 1–M. Because each row of the matrix 100 intersects each column, any tester resource A–N can be connected to any terminal 1–M of the UUT simply by closing the switch at the intersection point.

FIG. 2 shows how the matrix 100 can be controlled to make particular connections. For example, by closing switch A1, Tester Resource A is connected to UUT Terminal 1. Similarly, closing switch C2 connects Tester Resource C to UUT Terminal 2. To avoid multiple connections, all other switches in the row and column to be connected (e.g., row C and column 2 in the second example above) must remain open. The matrix 100 also allows different tester resources to be connected together, as shown by the connection of Tester Resources D to Tester Resource N via the closures of switches D3 and N3.

Although the matrix 100 is flexible, it can suffer from certain drawbacks. For instance, the matrix 100 has a switch at every intersection point. The number of switches thus grows exponentially with the size of the matrix (i.e., $N^2$ switches are needed for an N-by-N matrix). Switches used at interfaces of automatic test systems are generally mechanical relays. These relays require significant space, and large numbers of these relays tend to crowd space in the tester and particularly around the UUT, where it is often desirable to place other equipment. In addition, mechanical relays tend to be less reliable than other electronic components. Large numbers of relays tend to increase the likelihood that some relays will fail, and thus lowers the MTBF (Mean Time Between Failures) of the overall test system.

Another drawback of the matrix 100 is its introduction of transmission line stubs, which impair the ability of the matrix to pass high-frequency signals without distortion. As shown in FIG. 2, the connection of Test Resource A to UUT Terminal 1 leaves one stub extending from switch A1 to switch N1 and another stub extending from switch A1 to switch AM. These stubs distort signals passing between Test Resource A and UUT Terminal 1 by introducing impedance changes and reflections. The faster the signal, the more it will be distorted by stubs of any particular length.

Stubs lengths can be reduced in the matrix 100 by providing additional switches. For instance, a switch can be added immediately to the right of switch A1, which can be opened whenever A1 is closed, thereby reducing the stub running from A1 to AM. The added switch can be kept closed at other times. Similarly, a switch can be added immediately below A1 to reduce the stub running from A1 to N1. Although remedial measures like this can be taken, they tend to increase the number of relays required, and thus tend to yield diminishing returns.

BRIEF SUMMARY OF THE INVENTION

With the foregoing background in mind, it is an object of the invention to improve the signal integrity of switched signals without greatly increasing the number of switches required.

To achieve the foregoing object, as well as other objectives and advantages, a switching topology includes a plurality of switching circuits. Each switching circuit has at least a first port and a second port. Signals applied to the first port can be passed directly through to the second port or can be crossed enroute to the second port. Switching circuits of this type can be combined in a wide variety of ways to form switching topologies that provide high flexibility, short transmission line stubs, and relatively small numbers of switching elements.

BRIEF DESCRIPTION OF THE DRAWINGS

Additional objects, advantages, and novel features of the invention will become apparent from a consideration of the ensuing description and drawings, in which.

DETAILED DESCRIPTION OF THE PREFERRED EMBODIMENT

Figure 1:
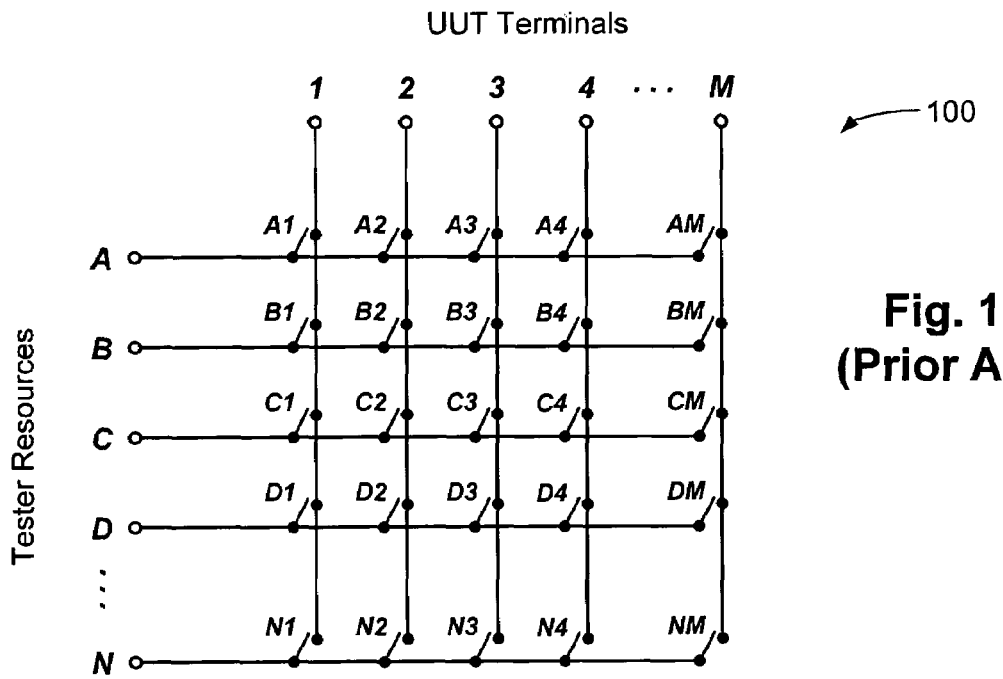
FIG. 1 is a simplified schematic of a full crosspoint matrix that is conventionally used in automatic test equipment for selectively connecting tester resources to pins of a unit under test (UUT)
Figure 2:
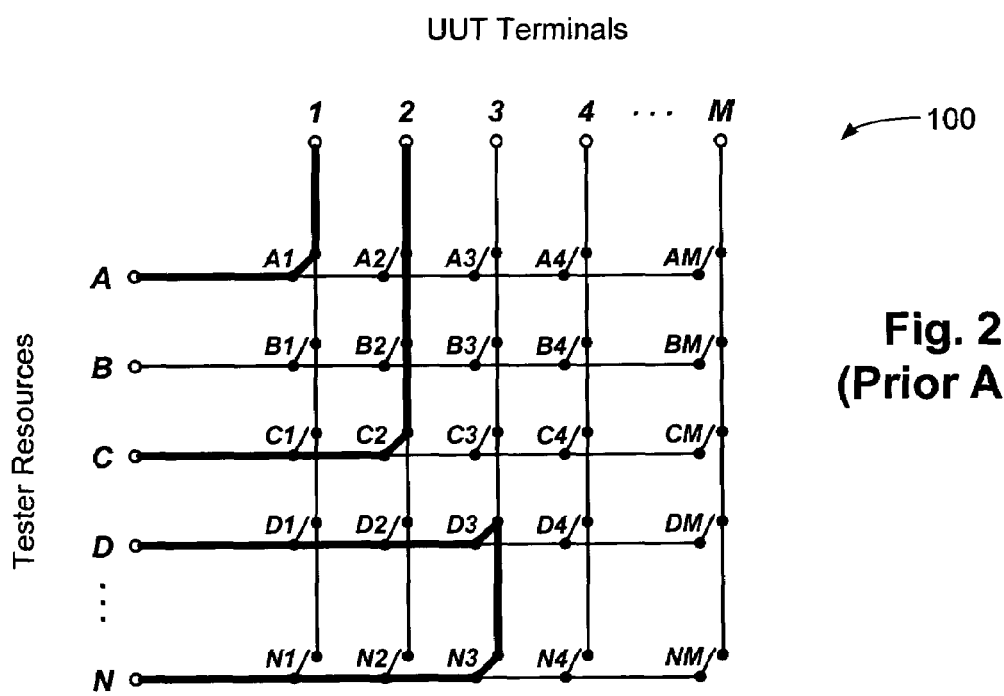
FIG. 2 is a simplified schematic of the matrix of FIG. 1 wherein certain connections are highlighted.
Figure 3A:
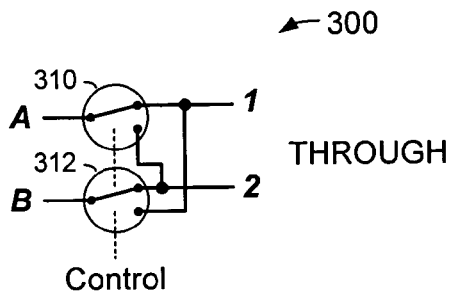
FIGS. 3A and 3B are simplified schematics showing a switching circuit according to the invention connected in THROUGH and CROSS configurations, respectively.
Figure 3B:
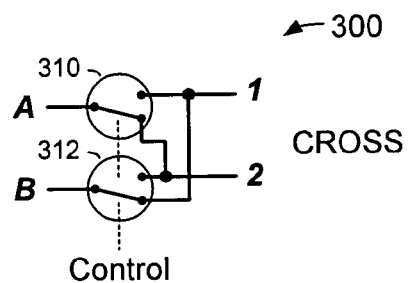

In accordance with the invention, switching circuits form building blocks from which arbitrarily large switching topologies can be constructed. FIGS. 3A and 3B show an example 300 of a switching circuit that can be used as a suitable building block.

As shown in FIG. 3A, the switching circuit 300 includes first and second switching elements 310 and 312. Each switching element has a common point and first and second connection points. In response to a control signal, the common point can be selectively connected to either the first connection point or to the second connection point.

The connection points of the first switching element 310 are connected one-to-one to the connection points of the second switching element 312. Preferably, connections between these points are made in inverse parallel (i.e., the first connection point of the first switching element is connected to second the connection point of the second switching element, and the second connection point of the first switching element is connected to the first connection point of the second switching element). The common points of the first and second switching elements 310 and 312 form a first pair of nodes (A and B) of the switching circuit 300. The two junctions formed by the joined connection points form a second pair of nodes (1 and 2) of the switching circuit 300.

Thus constructed, the switching circuit 300 can be operated to assume either a THROUGH configuration or a CROSS configuration. FIG. 3A shows the THROUGH configuration. Here, nodes A and B are respectively connected to nodes 1 and 2. FIG. 3B shows the CROSS configuration, wherein nodes A and B are crossed enroute to nodes 1 and 2—node A connects to node 2 and node B connects to node 1.

In the preferred embodiment, the first and second switching elements 310 and 312 are mechanical, Form-C relays. Preferably, these relays are identically constructed, so that they each respond to the same control signal by switching the same way. With the inverse parallel connection as shown, the switching circuit 300 can thus readily assume the THROUGH configuration for one state of a control signal and the CROSS configuration for another state of the control signal. Although direct parallel connection of the relays' connection points (first to first, second to second) can also work, it defeats the convenience of using a single control signal (or identical relays) and thus is not preferred.

Preferably, the two switching elements 310 and 312 are provided in a single multi-relay package. For example, a dual form-C relay package can accommodate both relays for a complete switching circuit 300. Packages of greater than 2 relays each can also be used for multiple switching circuits 300, to promote further miniaturization. Connections between the connection points of the first and second switching elements are formed via conductive paths on a printed circuit board or other circuit substrate to which the package connects. Signal integrity is maximized by making these traces as short as possible. Alternatively, it may be possible to modify a conventional multi-relay package to include the connections between the connection points internally. Internal connections would entail shorter connection paths between relays and thus would further improve signal integrity.

Figure 3C:
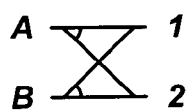
FIG. 3 is a schematic symbol that represents the switching circuit of FIGS. 3A and 3B.

FIG. 3C shows a symbol for the switching circuit 300. The nodes (A, B, 1, and 2) designated in FIG. 3C correspond to like-named nodes in FIGS. 3A and 3B. The arcs shown adjacent to nodes A and B designate the common points of the switching elements. This symbol is used in subsequent figures to indicate that nodes can be connected either directly (A to 1, B to 2) or crosswise (A to 2, B to 1).

Arbitrarily large switching topologies can be constructed using the switching circuit 300 as a basic 2-by-2 building block. To promote signal integrity, every node (A, B, 1, and 2) of any 2-by-2 building block must be connected to no more than one node of any other 2-by-2 building block. This constraint prevents the formation of simultaneous parallel connections at any node, and thus prevents the formation of stubs.

Figure 4A:
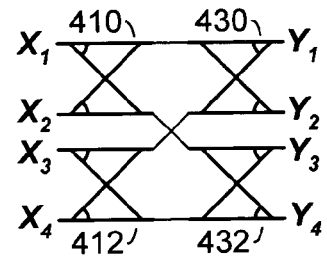
FIGS. 4A–4C are simplified schematics of three different 4-by-4 switching topologies constructed in accordance with the invention with switching circuits like the one shown in FIGS. 3A–3C.
Figure 4B:
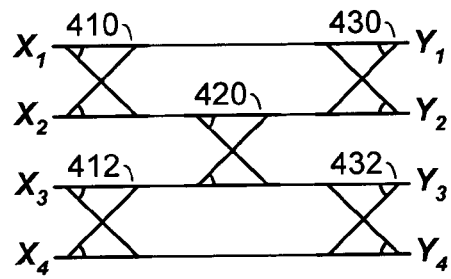
Figure 4C:
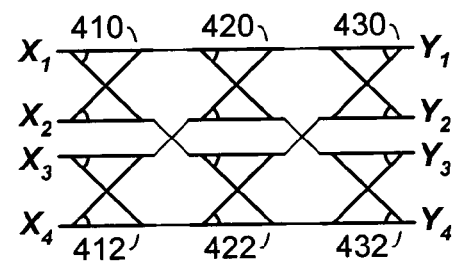

FIGS. 4A–4C show different 4-by-4 switching circuits constructed from 2-by-2 building blocks. FIG. 4A shows the simplest arrangement, wherein four building blocks are connected in a square configuration. By using only THROUGH and CROSS configurations for the building blocks 410, 412, 430, and 432, any node X1 through X4 on the left can be connected to any node Y1 through Y4 on the right. For example, X1 can be connected to Y1 by setting both building blocks 410 and 430 to THROUGH. As another example, X1 can be connected to Y4 by setting both building blocks 410 and 432 to CROSS.

Although the arrangement of FIG. 4A can connect any node on the left to any node on the right, it cannot connect left nodes to right nodes in all possible combinations. In particular, this arrangement cannot simultaneously connect both nodes of any one building block on the left to both nodes any one building block on the right. Thus, X1 and Y1 cannot be connected when X2 and Y2 are connected. Similarly, X1 and Y4 cannot be connected when X2 and Y3 are connected. This limitation arises because the topology provides only one physical connection between each building block on the left and each building block on the right.

FIG. 4B shows a somewhat more flexible 4-by-4 arrangement. The limitations describe above are partially overcome by adding building block 420. With building block 420 set to the THROUGH configuration, both nodes for any one building block can be connected simultaneously to both nodes on the laterally opposing building block (e.g., X1 can connect to Y1 at the same time that X2 connects to Y2). Note, however, that the limitation still applies to diagonally opposing nodes. With building block 420 in the CROSS configuration, each building block still has only one physical connection to its diagonally opposing neighbor.

FIG. 4C overcomes this limitation as well and supports all possible combinations of simultaneous left-to-right connections. By setting one of the middle column of building blocks (420 and 422) to CROSS and the other of these building blocks to THROUGH, the arrangement effectively becomes that of FIG. 4B, and the limitation on simultaneous lateral connections is overcome. In addition, by setting both blocks 420 and 422 to CROSS, two nodes from any building block can be made to connect diagonally across the topology, thereby overcoming the limitation on simultaneous diagonal connections.

Figure 5A:
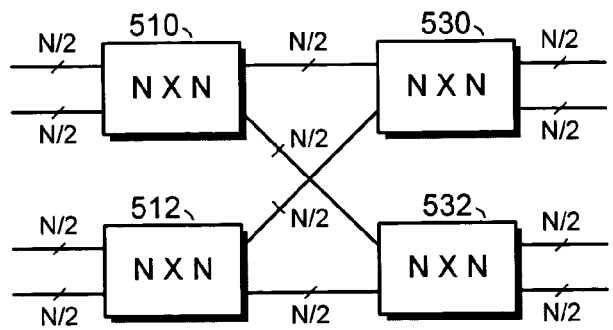
FIGS. 5A–5C are simplified schematics of three different N-by-N switching topologies constructed in accordance with the invention with switching circuits like the one shown in FIGS. 3A–3C.
Figure 5B:
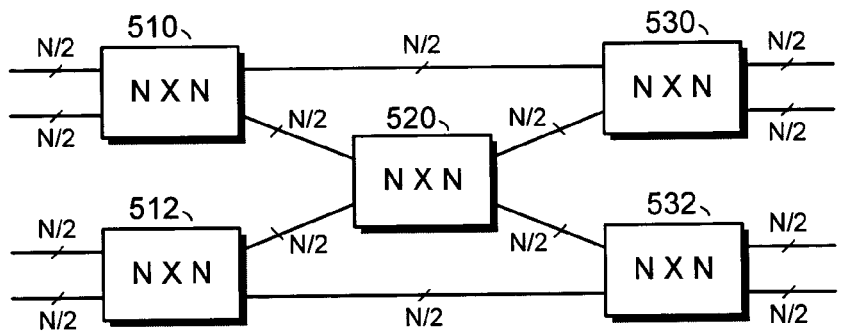
Figure 5C:
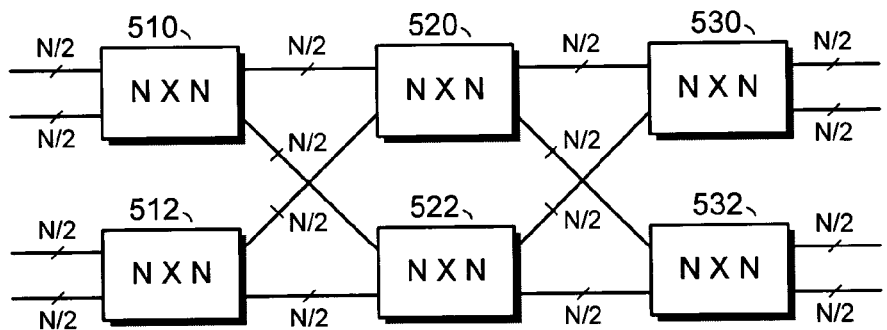

The principles behind the 4-by-4 switching topologies of FIGS. 4A–4C can be applied more generally to produce 2N-by-2N switching topologies, shown in FIGS. 5A–5C. These topologies have an analogous structure to the 4-by-4 topologies, but can be implemented on an arbitrarily large scale.

FIG. 5A shows a 2N-by-2N switching topology that is analogous in structure to the 4-by-4 switching topology of FIG. 4A. This 2N-by-2N topology includes 4N-by-N units. The N-by-N units are constructed of building blocks (i.e., switching circuits 300) interconnected using the general rule stated above—such that no node of any building block connects to more than 1 node of all the other building blocks. For N=2, the N-by-N units each consist of a single building block, and the topology of FIG. 5A effectively degenerates to that of FIG. 4A. For N=4, the N-by-N units can each be any of the 4-by-4 units shown in FIGS. 4A–4C. Larger units can be used as well, such as 8-by-8 units, 16-by-16 units, and so forth.

The topology of FIG. 5A is similar to that of FIG. 4A in terms of its limitations.

Only half of the N nodes of each N-by-N unit on the left can be connected at one time across the topology to any N-by-N unit on the right, either laterally or diagonally.

The topology of FIG. 5B partially overcomes this limitation by providing an additional N-by-N unit (520) at the crossover point (similar to the way the topology of FIG. 4B partially solved a similar problem with unit 420). Note that the switching limitations that applied to FIG. 4B can be overcome here if unit 520 can be made capable of connecting both pairs of N/2 nodes on the left to both pairs of N/2 nodes on the right, both laterally and diagonally.

The topology of FIG. 5C is analogous to that of FIG. 4C and allows all 2N nodes at the left to connect in any possible combination to all 2N nodes at the right.

The switching topologies described herein are essentially stub-free. The only evident stubs are within the relays or in the connections within the building blocks themselves (i.e., between the connection points of the switching elements 310 and 312). This lack of stubs preserves the integrity and bandwidth of electrical signals that are passed through these topologies. In addition, these gains in signal integrity are achieved without requiring large numbers of relays. Even the largest 4-by-4 topology, shown in FIG. 4C, requires only 12 form-C relays. A full-crosspoint 4-by-4 matrix requires 16 relays, and tends to have relatively poor high-frequency performance due to the effects of stubs. Reducing stubs in the full-crosspoint matrix requires the addition of many more relays.

Figure 6:
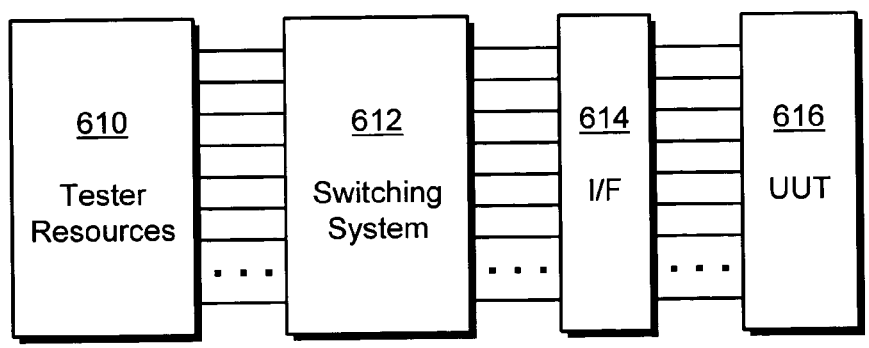
FIG. 6 is a block diagram of a portion of an automatic test system that includes a switching topology according to the invention.

A preferred use of the switching topologies and methods disclosed herein is for routing test signals in automatic test systems. FIG. 6 is a simplified block diagram of a portion of an automatic test system, wherein tester resources 610 are switchable via a switching system 612 to an interface 614, such as be a test fixture, a probe board, or a socket. A UUT 616, such as a semiconductor device or a circuit board, is connected to the interface 614 to allow signals to pass between the tester and the UUT. Tester resources 610 can be selectively applied to different nodes of the UUT by properly configuring the switching system 612.

Tests can be conducted by routing a first tester resource through the switching system 612 to a lead of a UUT, and monitoring the device's response to the first tester resource via a second tester resource connected to the UUT via the switching system. The device's response determines whether the device is within specifications our outside of specifications.

As is known, manufacturers of semiconductor devices commonly use automatic test systems to determine whether devices meet their requirements. Testing devices early in the manufacturing process allows devices that fail their tests to be discarded before additional manufacturing costs are incurred. In addition, sorting devices into different categories based on test results allows manufacturers to sell devices having different performance at different prices. By integrating the switching topologies and methods disclosed herein into automatic test systems, improved signal integrity can be achieved while reducing the number of relays required. Improved signal integrity allows devices to be tested to tighter tolerances, and thus allows good devices to be more readily distinguished from devices that fail to meet requirements.

Alternatives

Having described one embodiment, numerous alternative embodiments or variations can be made. For example, the switching elements 310 and 312 are preferably form-C relays. There are many other ways of constructing these elements, however. For instance, a pair of form-A can be connected together to provide essentially the same functionality as a single form-C relay. Other types of relays or combinations of relays that can be made to perform essentially the same function can be used, as well.

As described herein, the switching elements are preferably mechanical relays. The invention is not limited to implementations with mechanical relays, however. For example, micro-machined MEM switches may be used in place of conventional mechanical relays. Solid state switches may be used, as well.

Although the primary application of the invention is for switching electronic signals, the topologies and methods described herein are also applicable for switching optical signals.

As described herein, the switching circuit 300 supports two configurations—THROUGH and CROSS. Other configurations can be supported as well. For example, the switching circuit 300 can be made to support loopback by controlling the switching elements 310 and 312 independently, such as with separate control signals. By setting switching element 310 to the up position and setting switching element 312 to the down position (or vice-versa), node A can be looped back to node B. Loopback is available only for nodes connected to the common points of the switching elements. Node A can be looped back to node B, but node 1 cannot be looped back to node 2. Switching topologies can be constructed of building blocks with left-facing and/or right-facing common points to accommodate loopback of any particular nodes, as desired. Note that the direction in which the common points face has no effect on the basic switching functionality of the building blocks—it only affects loopback functionality. THROUGH and CROSS configurations are the same left-to-right as they are right-to-left.

Although specific embodiments have been disclosed herein, they are presented for illustrative purposes to show examples of how the principles of the invention can be applied. Accordingly, the disclosed embodiments should not be regarded as limiting the invention.

The specific embodiments disclosed have all been square topologies (N-by-N). The invention is not limited to square topologies, however. Rectangular topologies (N-by-M) may also be made. For instance, one can build an N-by-M topology, where N is greater than M, by building an N-by-N topology and removing building blocks not needed for the M dimension.

The switching topologies have been described for use with testers that share resources. However, the invention is not limited to any particular type of tester and may be used in any testing-related switching context.

Therefore, while the invention has been particularly shown and described with reference to the preferred embodiments thereof, it will be understood by those skilled in the art that various changes in form and detail may be made therein without departing from the spirit and scope of the invention.

What is claimed is:

1. A switching topology for automatic test equipment, comprising:
   a plurality of switching circuits each having first through fourth nodes, wherein the first and second nodes are connectable to the third and fourth nodes, respectively, to form a THROUGH connection, or to the fourth and third nodes, respectively, to form a CROSSED connection,
   wherein each of the first through fourth nodes of any of the plurality of switching circuits is connected to at most one of the first through fourth nodes of all the others of the plurality of switching circuits and each of the plurality of switching circuits comprises first and second switching elements each having a common point and first and second connection points to which the common point is selectively connectable.

2. A switching topology as recited in claim 1, wherein, for each of the plurality of switching circuits,
   the first and second nodes are the common points of the first and second switching elements, respectively,
   one of the first and second connection points of the first switching element is connected to one of the first and second connection points of the second switching element to form the third node of the switching circuit,
   the other of the first and second connection points of the first switching element is connected to the other of the first and second connection points of the second switching element to form the fourth node of the switching circuit.

3. A switching topology as recited in claim 2, wherein the first and second switching elements are form-C relays.

4. A switching topology as recited in claim 3, wherein the form-C relays for the first and second switching elements are located together in a dual form-C package.

5. A switching topology as recited in claim 4, wherein all connections between the first and second switching elements are formed within the dual form-C package.

6. A switching topology as recited in claim 4, wherein the first and second switching elements are controlled together in response to a single control signal.

7. A switching topology as recited in claim 1, wherein the switching circuits are implemented with micro-machined switches.

8. A switching topology as recited in claim 1, wherein the switching circuits are implemented with solid-state switches.

* * * * *